United States Patent
Neely et al.

[11] Patent Number: 5,327,101
[45] Date of Patent: Jul. 5, 1994

[54] DISTORTION-FREE LIMITER FOR A POWER AMPLIFIER

[75] Inventors: Gerald D. Neely, Dearborn, Mich.; Alfonso Molinar, Chihuahua, Mexico; Andrew C. Krochmal, Plymouth, Mich.; Robert T. Zeff, Modesto, Calif.

[73] Assignee: Ford Motor Company, Dearborn, Mich.

[21] Appl. No.: 85,369

[22] Filed: Jul. 2, 1993

[51] Int. Cl.$^5$ .............................................. H03G 3/30
[52] U.S. Cl. ..................................... 330/284; 330/136; 330/145; 330/280
[58] Field of Search ............... 330/136, 138, 145, 280, 330/284

[56] References Cited

U.S. PATENT DOCUMENTS

| | | | |
|---|---|---|---|
| 3,904,971 | 9/1975 | Delagrange | 330/284 X |
| 4,000,370 | 12/1976 | Smith et al. | 179/1 A |
| 4,048,573 | 9/1977 | Evans et al. | 330/2 |
| 4,233,566 | 11/1980 | Nestorovic | 330/59 |
| 4,318,053 | 3/1982 | Sondermeyer | 330/281 |
| 4,581,589 | 4/1986 | Ikoma | 330/280 |
| 4,849,713 | 7/1989 | Botti et al. | 330/284 |
| 4,912,424 | 3/1990 | Nicola et al. | 330/141 |
| 5,001,440 | 3/1991 | Zerod | 330/284 |

OTHER PUBLICATIONS

*A Dual-Band Audio Limiter*, James J. Noble, and Robert J. Bird, Journal of the Audio Engineering Society, pp. 678-684, Dec. 1969, vol. 17, No. 6.

*Primary Examiner*—James B. Mullins
*Attorney, Agent, or Firm*—Roger L. May; Mark Mollon

[57] ABSTRACT

A distortion limiter for limiting the amount of distortion of an inverting amplifier is disclosed. A comparator produces a pulse when a signal level at an inverting input of the inverting amplifier exceeds a reference voltage level. The pulse charges a capacitor. When the charge on the capacitor is sufficient to raise the gate voltage of a junction field-effect transistor (FET) above cutoff, the FET shunts the input signal to reduce its level. The distortion characteristics can be controlled by using a voltage divider to adjust the voltage across the FET. A bias voltage at the gate of the FET, keeps the FET turned off when the inverting amplifier is not clipping.

11 Claims, 1 Drawing Sheet

DISTORTION-FREE LIMITER FOR A POWER AMPLIFIER

BACKGROUND OF THE INVENTION

1. Field of the Invention

The present invention relates generally to audio amplifiers, and more specifically to a distortion limiter to minimize amplifier clipping.

2. Related Art

Typically audio reproduction systems include a variable-gain preamplification stage, followed by a fixed-gain power amplifier. The power amplifier drives an output transducer such as a speaker. A volume control voltage, provided to the preamplification stage, controls the signal level provided to the power amplifier stage and thus controls the output volume.

One objective in designing audio systems such as the one described above is to introduce a minimum amount of distortion into the audio signal. Typically, as the magnitude of the signal provided from the variable-gain preamplification stage to the power amplifier increases above a certain level, the power amplifier may be overdriven. This occurs when the input signal to the power amplifier, multiplied by the fixed gain of the power amplifier, approaches the supply voltage provided to the power amplifier. At these high input signal levels, the power amplifier saturates and the signal peaks of the audio signal are distorted. This phenomenon is known as clipping.

In some applications, such as portable systems or automotive audio systems, the problem of clipping is more severe. This is because these systems have a limited electrical supply voltage (e.g. the 12-volt automotive system) which results in limited voltage headroom provided to the amplifier.

Many conventional distortion limiters use a feedback loop to limit the level of the input signal. In one system, described in U.S. Pat. No. 4,048,573, to Evans, et al. (referred to as '573), a difference amplifier 30 is used to amplify the difference in signal level between input and output signals of a power amplifier 20. The output signal of power amplifier 20 is provided to difference amplifier 30 via a feedback circuit 25. The output signal of difference amplifier 20 is fed to a full wave rectifier 32, the output of which drives an attenuator 31. When an excess signal is input to power amplifier 20 causing clipping, differential amplifier 30 outputs a signal in accordance with the difference between the amplifier input signal and the amplifier output signal. This difference results in an attenuation of the input signal by way of rectifier 32 and attenuator 31.

Another disadvantage with the '573 reference is that the feedback signal is provided to a light-emitting diode to control the amount of signal shunted to ground via a light-dependent resistor (in attenuator 31). Such optical devices are relatively costly, may be unreliable and provide a relatively slow response time to the occurrence of clipping.

A further disadvantage of the '573 reference is the manner in which differential amplifier 30 is connected to power amplifier 20. The inputs to amplifier 20 are also the inputs to amplifier 30. Thus the inputs to amplifier 20 are common mode voltage on amplifier 30. Because there is potentially a large voltage swing on differential amplifier 30, additional noise in the circuit could be introduced. Additionally, there are two connections between the two amplifiers. As a result, the common mode range is more critical due to loading.

Another conventional technique is disclosed in U.S. Pat. No. 4,581,589, to Ikoma (referred to as '589). According to the '589 reference a reference means 41 provides a first reference voltage lower than the upper saturation voltage (upper clipping level) of the amplifier 20, and a second reference voltage higher than the lower saturation voltage of amplifier 20. These reference voltages are provided to a comparing and controlling means 40 for comparison with the output signal from amplifier 20. When the output signal goes out of the range defined by the saturation voltages (the reference voltages), comparing and controlling means 40 produces an output signal that is fed to the signal attenuator to reduce the input signal.

SUMMARY OF THE INVENTION

According to the present invention, clipping is minimized by providing a feedback loop to adjust the level of the input signal in response to amplifier clipping. An inverting amplifier is used as the output amplifier. The inverting amplifier has a virtual ground at a node associated with its input. When the variable-level input signal is at a level where clipping occurs in the amplifier, the amplifier cannot maintain the virtual ground at zero volts. As the clipping increases, the voltage present at the virtual ground node increases.

The voltage at the virtual ground node is compared with a reference voltage using a comparator. The comparator generates a positive-going pulse when the voltage at the virtual ground node exceeds the reference voltage. This pulse is integrated and builds up a charge in a capacitor.

A junction field-effect transistor (FET) is held in cutoff by a negative gate voltage supplied at its gate through a decay resistor. Upon clipping, the pulse generated by the comparator builds charge in the capacitor, which causes the voltage at the gate of the FET to become less negative. When the negative voltage at the gate of the FET decreases to the FET's cutoff voltage, a portion of the input signal to the amplifier is shunted through the FET to ground. In this manner, output distortion is reduced to a predictable level.

The FET is connected between the amplifier input and ground. This connection is made using a voltage divider to adjust the voltage across the channel of the FET. This allows the distortion characteristics of the FET to be controlled. Because the FET is not as sensitive as current limiters used in some conventional circuits, it is more predictable and does not require frequent realignment. As a result, the voltage divider can be implemented using fixed resistors. Alternatively, a potentiometer can be used to implement the voltage divider.

The RC time constant of an integrator between the comparator and the FET is used to control the attack time (the amount of time it takes for the distortion limiter to respond to clipping) of the distortion limiter. Similarly, the decay time (the amount of time it takes for the distortion limiter to remove the attenuation when the amplifier goes out of clipping) is controlled by the RC time constant of the resistor used in line with the bias voltage supplied and the capacitor used in the integrator.

The FET contributes its own distortion due to the varying gate to channel voltage which causes the FET's own resistance to also vary accordingly. The distortion characteristics (harmonic content) can thus be controlled by controlling the magnitude of the voltage across the channel of the FET. This is controlled by the ratio of resistances (voltage divider) connected between the FET and the input signal, and the FET and the input to the amplifier.

An advantage of the invention is that it minimizes clipping distortion from an audio amplifier while also minimizing the introduction of additional distortion. This is accomplished in part by biasing the circuit so that the FET is off when the amplifier is not clipping. As a result, the FET adds virtually no distortion to the non-clipping amplifier.

Another advantage of the invention is that because the distortion magnitude is compared to a reference voltage, the results of the limiter are repeatable and predictable.

Yet another advantage of the invention is that because the gain control device is a FET, the circuit is cheaper to implement, more reliable, and has a faster attack time than circuits using optical devices (LED/LDR pairs) to control the signal level.

Still another advantage of the invention is that the circuit uses an inverting power amplifier with a virtual ground. As a result, a simplified comparator circuit can be used to detect clipping and a differential amplifier is not needed. Also, the virtual ground reduces the common mode voltage swing on the comparator to zero.

A further advantage of the invention is that there is only one connection between the comparator and the amplifier. As a result, the comparator has less influence on the amplifier.

An additional advantage of the invention is that the amount of distortion introduced by the FET can be minimized by minimizing the source-to-drain voltage across the FET. This is accomplished by using a voltage divider (such as a potentiometer) between the signal source and the inverting amplifier. The signal shunted to ground via the FET is tapped from the voltage divider. The magnitude of the voltage provided to the FET is selected to minimize distortion.

Further features and advantages of the present invention, as well as the structure and operation of various embodiments of the present invention, are described in detail below with reference to the accompanying drawings.

BRIEF DESCRIPTION OF THE DRAWINGS

The present invention will be described with reference to the accompanying drawing, wherein.

DETAILED DESCRIPTION OF PREFERRED EMBODIMENTS

Figure 1:
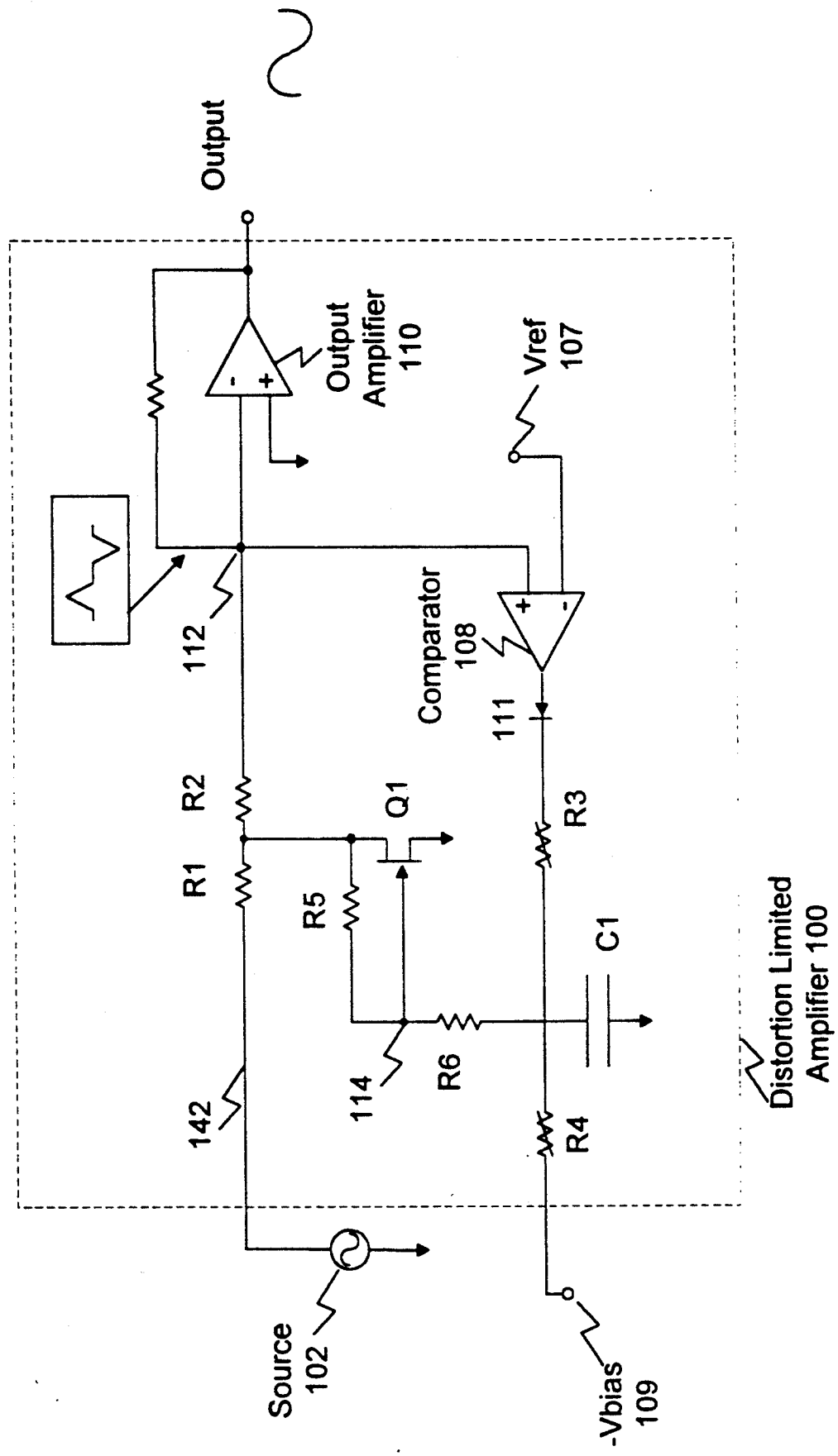
FIG. 1 is a schematic diagram illustrating a distortion limiter according to the present invention.

The present invention is directed toward a system and method for limiting the distortion of an amplifier. FIG. 1 is a schematic diagram illustrating a representative embodiment of a distortion limited amplifier 100. Referring to FIG. 1, a source 102 provides an analog signal to distortion limited amplifier 100. Source 102 can be a preamplifier stage or some other source of an audio, video, or RF signal. For the purposes of this discussion, source 102 will be considered to be an audio preamplifier. Source 102 provides a variable-level audio signal 142 to distortion limited amplifier 100.

Distortion limited amplifier 100 includes an output amplifier 110, a comparator 108 and a junction field-effect transistor (FET) Q1. When amplifier 110 is not clipping, FET Q1 is held below cutoff (turned off) by a bias voltage Vbias.

In this patent document, FET Q1 is referred to as a junction field-effect transistor. It will be apparent to those skilled in the relevant art how other transistor types (e.g. bipolar) may be used in place thereof.

A key feature of distortion limited amplifier 100 is that output amplifier 110 is configured as an inverting amplifier having a virtual ground at a node 112. When audio signal 142 is at a level such that clipping occurs in output amplifier 110, output amplifier 110 cannot maintain the virtual ground at zero volts. As the clipping of amplifier 110 increases, the voltage present at node 112 also increases.

When the voltage at node 112 exceeds a reference voltage 107, a comparator 108 produces a positive-going pulse. Capacitor C1 and resistor R3 integrate this pulse, charging capacitor C1.

The voltage at a gate 114 of a junction field-effect transistor (FET) Q1, is held low by Vbias via resistor R4. Thus, FET Q1 is off when amplifier 110 is not clipping. When capacitor C1 charges (when amplifier 110 clips), the negative voltage at node 114 of FET Q1 decreases to the cutoff voltage of FET Q1. At this point, FET Q1 turns on and a portion of audio signal 142 is shunted to ground via FET Q1. This has the effect of attenuating audio signal 142 and thereby limits clipping. Resistors R5 and R6 are provided to linearize FET Q1.

The RC time constant of resistor R3 and capacitor C1 are used to control the attack time of the circuit. The larger the time constant, the longer it takes the circuit to respond to clipping. The time constant may be chosen so that brief periods of clipping (resulting in narrow pulses) do not charge capacitor C1 to a level above FET cutoff.

The RC time constant of resistor R4 and capacitor C1 controls the decay time of the circuit. Resistors R4, R3 can be implemented as variable resistors to allow the time constants to be adjusted.

A diode 111 is provided between comparator 108 and resistor R3. This diode passes current from comparator 108 to charge capacitor C1 when clipping occurs. When amplifier 110 is not clipping, diode 111 keeps comparator 108 from discharging capacitor C1 through resistor R3. Thus, if a short attack time is chosen by C1 and R3, a long decay time can still be provided by C1 and R4 without discharge via R3.

FET Q1 is a non-linear device and acts as a source of distortion. The linearity of FET Q1 depends on the magnitude of the voltage across the FET's channel (source-to-drain voltage). As the voltage decreases, the linearity of FET Q1 increases. The voltage is controlled by the ratio of resistances R1 and R2 which in turn controls the overall harmonic characteristics of distortion limited amplifier 100.

In an alternative embodiment, a potentiometer may be used in place of resistors R1 and R2. Limiting resistors may be included on either side of the potentiometer.

Vbias and R4 are selected such that FET Q1 is turned off when amplifier 110 is not clipping. As a result, FET Q1 is essentially an open circuit and has virtually no effect on audio signal 142 unless amplifier 110 is clipping. As a result, this potential source of distortion is minimized when amplifier 110 is not clipping.

An initialization circuit (not shown) may be provided to supply a negative voltage to capacitor C1 when power is turned on. This insures that signal 142 is not attenuated at power-up when amplifier 110 is not clipping.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A distortion limiting amplifier for amplifying a variable-level input signal, comprising:
    an inverting amplifier having an inverting input and a non-inverting input, wherein said inverting input is configured to receive said input signal and said non-inverting input is connected to a first reference voltage;
    a comparator, having a first input coupled to said inverting input of said inverting amplifier, configured to generate a pulse when a signal level at said inverting input exceeds a second reference voltage supplied to a second input of said comparator;
    an integrator, coupled to an output of said comparator, for storing a charge in response to said pulse produced by said comparator; and
    gating means, coupled between said inverting input and ground, having a gate coupled to said integrator, and held below cutoff by a bias voltage at said gate, for attenuating an input signal when said stored charge causes the gate voltage to exceed a cutoff voltage of said gating means.

2. The apparatus of claim 1, wherein said integrator comprises:
    a resistor coupled between said output of said comparator and said gate of said gating means; and
    a capacitor, coupled between said gate of said gating means and ground;
    wherein said capacitor stores charge in response to said pulse produced by said comparator.

3. The apparatus of claim 1, further comprising resistive means, coupled between said gating means and said input of said inverting amplifier, configured to control the voltage across said gating means.

4. The apparatus of claim 1, further comprising a diode, coupled between said comparator and said integrator, configured to keep said comparator from discharging said integrator.

5. A distortion limiting apparatus for use with an inverting amplifier, comprising:
    a comparator, coupled to an inverting input of the inverting amplifier, for comparing an input voltage at said inverting input to a reference voltage and for producing a pulse when the level of said input voltage exceeds the level of said reference voltage;
    an integrator, coupled to an output of said comparator, for storing a charge in response to said pulse produced by said comparator;
    gating means, coupled between said inverting input and ground, having a gate coupled to said integrator, and held below cutoff by a bias voltage at said gate, for attenuating an input signal when said stored charge causes the gate voltage to exceed a cutoff voltage of said gating means.

6. The apparatus of claim 5, wherein said integrator comprises:
    a resistor coupled between said output of said comparator and said gate of said gating means; and
    a capacitor, coupled between said gate of said junction field-effect transistor and ground;
    wherein said capacitor stores charge in response to said pulse produced by said comparator.

7. The apparatus of claim 5, further comprising resistive means, coupled between said gating means and said input of said inverting amplifier, configured to control the voltage across said gating means.

8. The apparatus of claim 5, further comprising a diode, coupled between said comparator and said integrator, configured to keep said comparator from discharging said integrator.

9. A method of limiting clipping of an inverting amplifier, comprising the steps of:
    (a) comparing a signal level at an inverting input of said inverting amplifier to a reference voltage and generating a pulse when said signal level exceeds said reference voltage level;
    (b) storing a charge in response to said pulse generated in said step (a); and
    (c) shunting a portion of the input signal to ground through a gating means when said stored charge causes a gate voltage of said gating means to rise above cutoff.

10. The method of claim 9, further comprising the step of maintaining the gate voltage of said gating means below cutoff when the inverting amplifier is not clipping.

11. The method of claim 9, further comprising the step of adjusting the voltage across said gating means to control the harmonic characteristics of said gating means.

* * * * *